(12) United States Patent
Hong et al.

(10) Patent No.: US 9,791,989 B2
(45) Date of Patent: Oct. 17, 2017

(54) STRETCHABLE DISPLAY

(71) Applicant: Samsung Display Co., Ltd., Yongin-si (KR)

(72) Inventors: Jong Ho Hong, Yongin-si (KR); Won Sang Park, Yongin-si (KR); Won Il Choi, Ansan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/929,931

(22) Filed: Nov. 2, 2015

(65) Prior Publication Data

US 2016/0320878 A1 Nov. 3, 2016

(30) Foreign Application Priority Data

Apr. 30, 2015 (KR) .................. 10-2015-0062067

(51) Int. Cl.
| | | |
|---|---|---|
| *G06F 3/045* | (2006.01) | |
| *G06F 3/044* | (2006.01) | |
| *G06F 1/16* | (2006.01) | |
| *G09G 3/3233* | (2016.01) | |
| *H01L 27/32* | (2006.01) | |

(52) U.S. Cl.
CPC ............ *G06F 3/044* (2013.01); *G06F 1/1652* (2013.01); *G09G 3/3233* (2013.01); *H01L 27/3244* (2013.01); *G06F 2203/04102* (2013.01)

(58) Field of Classification Search
CPC ................. G06F 3/044; G06F 1/1652; G06F 2203/04102
USPC ....................................................... 345/174
See application file for complete search history.

(56) References Cited

U.S. PATENT DOCUMENTS

| | | | |
|---|---|---|---|
| 7,268,491 B2 | 9/2007 | Aksamit et al. | |
| 8,207,473 B2 | 6/2012 | Axisa et al. | |
| 8,217,381 B2* | 7/2012 | Rogers ................ | H01L 21/8258 257/40 |
| 8,389,862 B2 | 3/2013 | Arora et al. | |
| 8,536,667 B2 | 9/2013 | De Graff et al. | |
| 2009/0219225 A1* | 9/2009 | Cope .......................... | G09F 9/30 345/55 |
| 2010/0002402 A1 | 1/2010 | Rogers et al. | |

(Continued)

FOREIGN PATENT DOCUMENTS

| | | |
|---|---|---|
| JP | 2007-127730 | 5/2007 |
| KR | 10-2011-0023996 | 3/2011 |
| KR | 10-2014-0022180 | 2/2014 |

OTHER PUBLICATIONS

Kim et al., Negatively Strain-Dependent Electrical Resistance of Magnetically Arranged Nickel Composites: Application to Highly Stretchable Electrodes and Stretchable Lighting Devices, Advanced Materials, 2014, 26, 3094-3099.

*Primary Examiner* — Claire X Pappas
*Assistant Examiner* — Ngan T Pham Lu
(74) *Attorney, Agent, or Firm* — H.C. Park & Associates, PLC

(57) ABSTRACT

A stretchable display includes: a stretchable substrate including first areas and second areas; main pixels disposed on the first areas of the stretchable substrate, the main pixels configured to display different colors; and at least one sub-pixel disposed on the second areas of the stretchable substrate, the at least one sub-pixel being configured to display one color that is the same as any one of the main pixels.

19 Claims, 8 Drawing Sheets

(56) References Cited

U.S. PATENT DOCUMENTS

| | | | |
|---|---|---|---|
| 2011/0050642 A1* | 3/2011 | Lee | G02F 1/167 |
| | | | 345/175 |
| 2012/0052268 A1 | 3/2012 | Axisa et al. | |
| 2012/0314400 A1 | 12/2012 | Bohn et al. | |
| 2014/0183473 A1* | 7/2014 | Lee | H01L 51/0097 |
| | | | 257/40 |

* cited by examiner

STRETCHABLE DISPLAY

CROSS-REFERENCE TO RELATED APPLICATION

This application claims priority from and the benefit of Korean Patent Application No. 10-2015-0062067, filed on Apr. 30, 2015, which is hereby incorporated by reference for all purposes as if fully set forth herein.

BACKGROUND

Field

Exemplary embodiments relate to a display. More particularly, the present disclosure relates to a stretchable display.

Discussion of the Background

A stretchable display is a display having a panel which may be increased in size or stretched. A stretchable display according to the prior art may have a structure including a flexible panel hidden in the display panel which may be stretched to extend an area viewed to a user. The display panel of the stretchable display according to the prior art is not actually stretched, and the stretchable display according to the prior art may also have a great thickness.

According to a stretchable display developed by University of Illinois at Urbana-Champaign (UIUC), which includes a light emitting diode (LED) light emitting part and a flexible connecting part, LEDs are individually formed by transferring process, and therefore, the stretchable display may not be suitable to manufacture a display having a large-area and high-resolution. Since the stretchable display includes the connecting part having a significant region, the stretchable display has a low resolution, and the low resolution further decreases when the stretchable display is stretched. Furthermore, when the stretchable display according to the prior art is disposed on a curved surface, the stretchable display device may have various stretching rate depending on a position of the stretchable display on the curved surface, and therefore, the stretchable display device may have different resolution for each position.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a stretchable display having advantages of implementing a high resolution by reducing or preventing a decrease in a resolution at the time of being stretched.

Additional aspects will be set forth in the detailed description which follows, and, in part, will be apparent from the disclosure, or may be learned by practice of the inventive concept.

An exemplary embodiments discloses a stretchable display including: a stretchable substrate including first areas and second areas; main pixels disposed on the first areas of the stretchable substrate, the main pixels configured to display different colors; and at least one sub-pixel disposed on the second areas of the stretchable substrate, the at least one sub-pixel being configured to display one color that is the same as any one of the main pixels.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
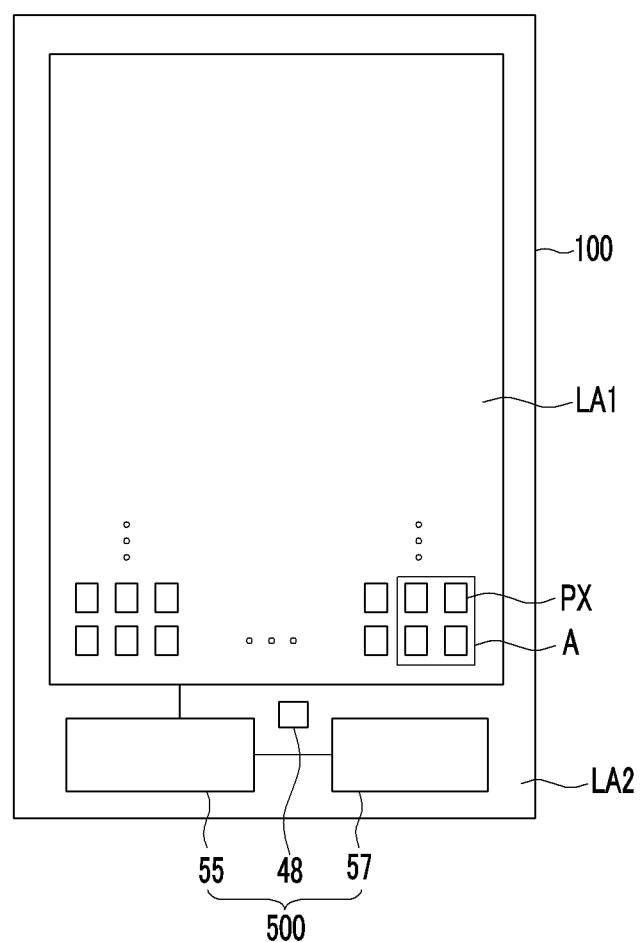
FIG. 1 is a plan view of a stretchable display according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein. Hereinafter, a stretchable display according to an exemplary embodiment will be described in detail with reference to the accompanying drawings.

Figure 2:
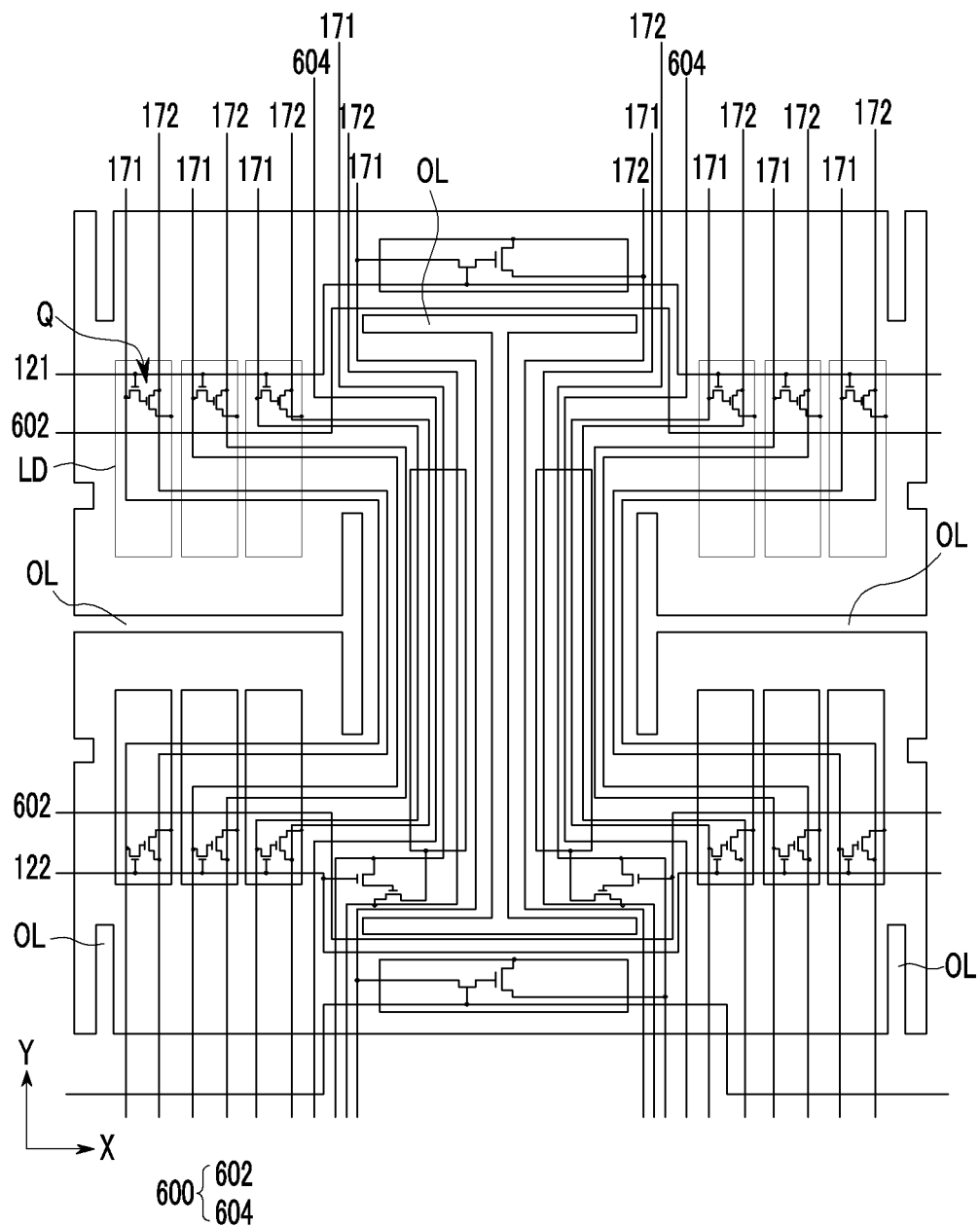
FIG. 2 is an enlarged layout view of part A of FIG. 1.

FIG. 1 is a plan view of a stretchable display according to an exemplary embodiment. FIG. 2 is an enlarged layout view of part A of FIG. 1, and FIG. 3 is a layout view showing a substrate and a pixel of FIG. 2.

Referring to FIG. 1, the stretchable display 1000 according to an exemplary embodiment includes a substrate 100 having a pixel area LA1 and a peripheral area LA2, pixels PX disposed in the pixel area LA1, and a driver 500 disposed in the peripheral area LA2 and connected to the pixels by signal lines.

Figure 3:
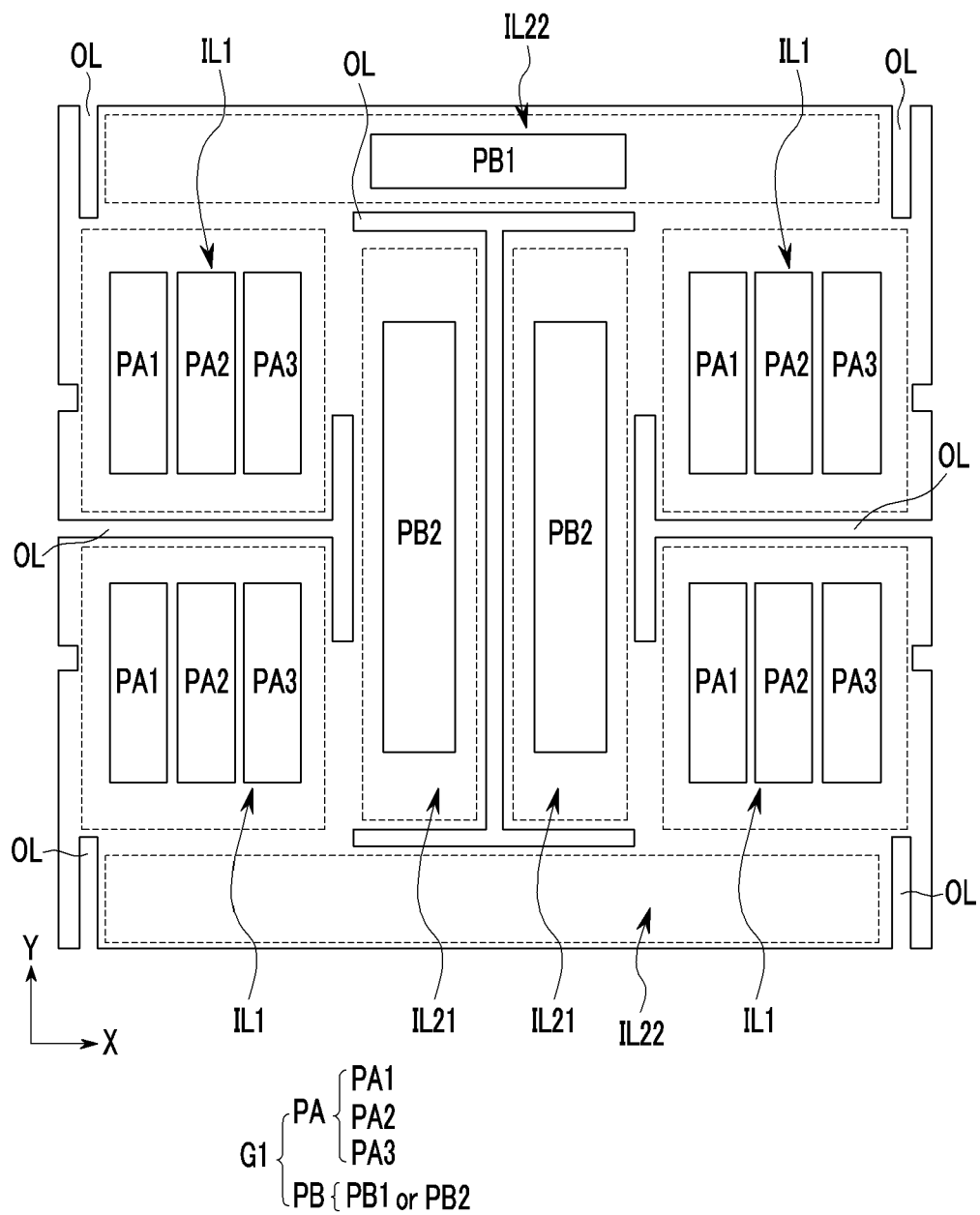
FIG. 3 is a layout view showing a substrate and a pixel of FIG. 2.

Referring to FIGS. 2 and 3, the substrate 100 may be a stretchable substrate, and may include at least one of a polymer material such as silicon elastomer, polyurethane, and the like.

The substrate 100 includes a plurality of cutouts OLs disposed in a first direction X and a second direction Y, and includes a plurality of islands IL1 and a plurality of bridges IL21 and IL22, which are partially surrounded by the cutouts.

The plurality of cutouts OLs are disposed between adjacent islands of the plurality of islands IL1, between adjacent bridges of the plurality of bridges IL21 and IL22, and between one island of the plurality of islands IL1 and one bridge of the plurality of bridges IL21 and IL22 adjacently disposed, wherein each of the plurality of islands IL1 and the plurality of bridges IL21 and IL22 may be disposed spaced apart from each other at a predetermined interval.

The plurality of bridges IL21 and IL22 include a vertical bridge IL21 disposed between the plurality of islands IL1 adjacent in the first direction X, and a horizontal bridge IL22 disposed between the plurality of islands IL1 and the vertical bridge IL21 adjacent in the second direction Y.

When the substrate 100 is stretched in the first direction X or the second direction Y, the substrate 100 may stretch or shrink as a width of the cutout OL disposed between the plurality of islands IL1 and the plurality of bridges IL21 and IL22 is increased or decreased. (Refer to FIG. 4). Therefore, when the substrate 100 is stretched, shapes of the plurality of islands IL1 and the plurality of bridges IL21 and IL22 are not substantially distorted, so shapes of the pixels disposed on the plurality of islands IL1 and the plurality of bridges IL21 and IL22 may not be distorted.

The pixel includes a main pixel PA disposed on the plurality of islands IL1 and a sub-pixel PB disposed on the plurality of bridges IL21 and IL22. The sub-pixel includes a first sub-pixel PB1 disposed on the horizontal branch IL22 and a second sub-pixel PB2 disposed on the vertical branch IL21.

Each pixel includes light emitting elements LD such as an organic light emitting diode (OLED), a polymer light emitting diode (PLED), a quantum dot (QD), a light emitting diode (LED), and the like, and transistors Q (Qs, Qd) connected to the light emitting elements LD to control the light emitting elements LD.

Each pixel may include corresponding light emitting element to display any one color of a red color, a green color, and a blue color. For example, the main pixel PA may include a red pixel PA1, a green pixel PA2, and a blue pixel PA3 each configured to display the red color, the green color, and the blue color, and may further include a white pixel (not shown). The sub-pixel PB may be configured to display the green color, but the exemplary embodiments are not limited thereto, and the sub-pixel PB may be a pixel configured to display a color displayed by any one pixel of the main pixel PA, and may be any one of a red pixel, a green pixel, and a blue pixel.

The pixels according to an exemplary embodiment may include pixel groups G1. Each of the pixel groups G1 may include one main pixel PA disposed on the plurality of islands IL1 and one of the first sub-pixel PB1 disposed on the horizontal bridge IL22 or the second sub-pixel part PB2 disposed on the vertical bridge IL21. The pixel groups G1 may be arranged to configure a matrix.

Referring to FIG. 2, a plurality of signal lines 121, 122, 171, and 172 for driving the pixels and a sensing line 600 for measuring a distortion rate of the substrate 100 are disposed on the substrate 100.

The plurality of signal lines include gate lines 121 and 122, data lines 171, and driving voltage lines 172 connected to the transistors Qs of the pixels. The signal lines may include further signal lines depending on the transistors Qs included in the pixels. The gate lines 121 and 122 may be disposed extending in the first direction X, and the data lines 171 and the driving voltage lines 172 may be disposed extending in the second direction Y each other. The gate lines 121 and 122 and the driving voltage lines may be insulated from each other.

Since the plurality of cutouts OLs are disposed between the adjacent islands of the plurality of islands ILL the gate lines 121 and 122 are disposed along the horizontal bridges IL22 to bypass the plurality of cutouts OLs, and the data lines 171 and the driving voltage lines 172 are disposed along the vertical bridges IL21 to bypass the plurality of cutouts OLs, so therefore, the gate lines 121 and 122, data lines 171, and the driving voltage lines 172 may be connected to the pixels PX disposed on the plurality of islands IL1 and the plurality of bridges IL2.

The gate lines 121 and 122 may include first gate lines 121 and second gate lines 121. The first gate lines 121 connects the pixels PA1, PA2, and PA3 of the main pixels PAs and the first sub-pixels PB1 of the sub-pixels PB disposed on the horizontal bridges IL22. The second gate lines 122 connecting between the pixels PA1, PA2, and PA3 of the main pixels PAs and the second sub-pixels PB2 of the sub-pixels PB disposed on the vertical bridges IL21, wherein the first gate lines 121 and the second gate lines 122 may be disposed alternately.

The sensing lines 600 configured to measure the distortion rate of the substrate 100 are disposed on the substrate 100 insulated from the signal lines 121, 122, 171, and 172. The sensing lines 600 may be distorted depending on the distortion of the substrate 100 from stretching. Therefore, resistances of the sensing lines 600 may be changed accordingly. The sensing lines 600 are connected to a resistance sensing sensor 48 (See FIG. 1), which may measure the resistances of the sensing lines 600.

The sensing lines 600 may be formed of at least one layer including at least one of a conductive nano material, a metal nano wire, a carbon nano tube (CNT), a conductive polymer, a metal nano-fiber, and a graphene.

The sensing lines 600 may include first sensing lines 602 and a second sensing lines 604. The first sensing lines 602 and the second sensing lines 604 may be disposed in a matrix shape, and the first sensing lines 602 may be disposed extending in the first direction X and the second sensing lines 604 may be disposed extending in the second direction Y crossing the first sensing lines 602. The first sensing lines 602 and the second sensing lines 604 are insulated from each other. The sensing lines 602 and 604 may be disposed along the plurality of bridges IL21 and IL22 to bypass the cutouts, similar to the gate lines 121 and 122, the data lines 171, and the driving voltage lines 172.

Since the first sensing lines 602 and the second sensing lines 604 are disposed crossing each other to form a matrix shape, a position of a distorted pixel of the substrate 100 may be recognized. That is, the position of the distorted pixel may be recognized by detecting a change of resistance at intersection points between the first sensing line 602 and the second sensing line 604.

According to the exemplary embodiment, the sensing lines 602 and 604 are respectively disposed every pixel columns and pixel rows, but the exemplary embodiments are not limited thereto, and the sensing lines 602 and 604 may be formed every plural pixel columns and plural pixel rows.

The sensing lines 602 and 604 and the signal lines 121, 122, 171, and 172 of FIG. 2 may be connected to the driver 500 shown in FIG. 1. The driver 500 may be a separate driving chip mounted on the stretchable substrate 100 or may be a driving circuit integrated on the substrate 100 with the transistors of the pixel.

Referring to FIG. 1, the driver 500 may include a data driver 55, the resistance sensing sensor 48, and an image processor 57.

The image processor 57 receives image data from external device, processes the image data, and transmits the image data to the data driver 55. The image data transmitted from the image processor 57 to the data driver 55 may be image data corresponding to the pixels of the main pixel and/or the pixels of the main pixel and the sub-pixel.

The data driver 55 receives the image data from the image processor 57 and converts the image data into a data signal. In addition, the data driver 55 transmits the converted data signal to data lines 171.

The resistance sensing sensor 48 is connected to the sensing lines 600 disposed on the stretchable substrate 100 to measure a resistance value of the sensing lines 600, and transmits the measured resistance value to the data driver 55 and/or the image processor 57. The resistance sensing sensor 48 may obtain position information of the distorted pixel by recognizing change in the resistance value.

Figure 4:
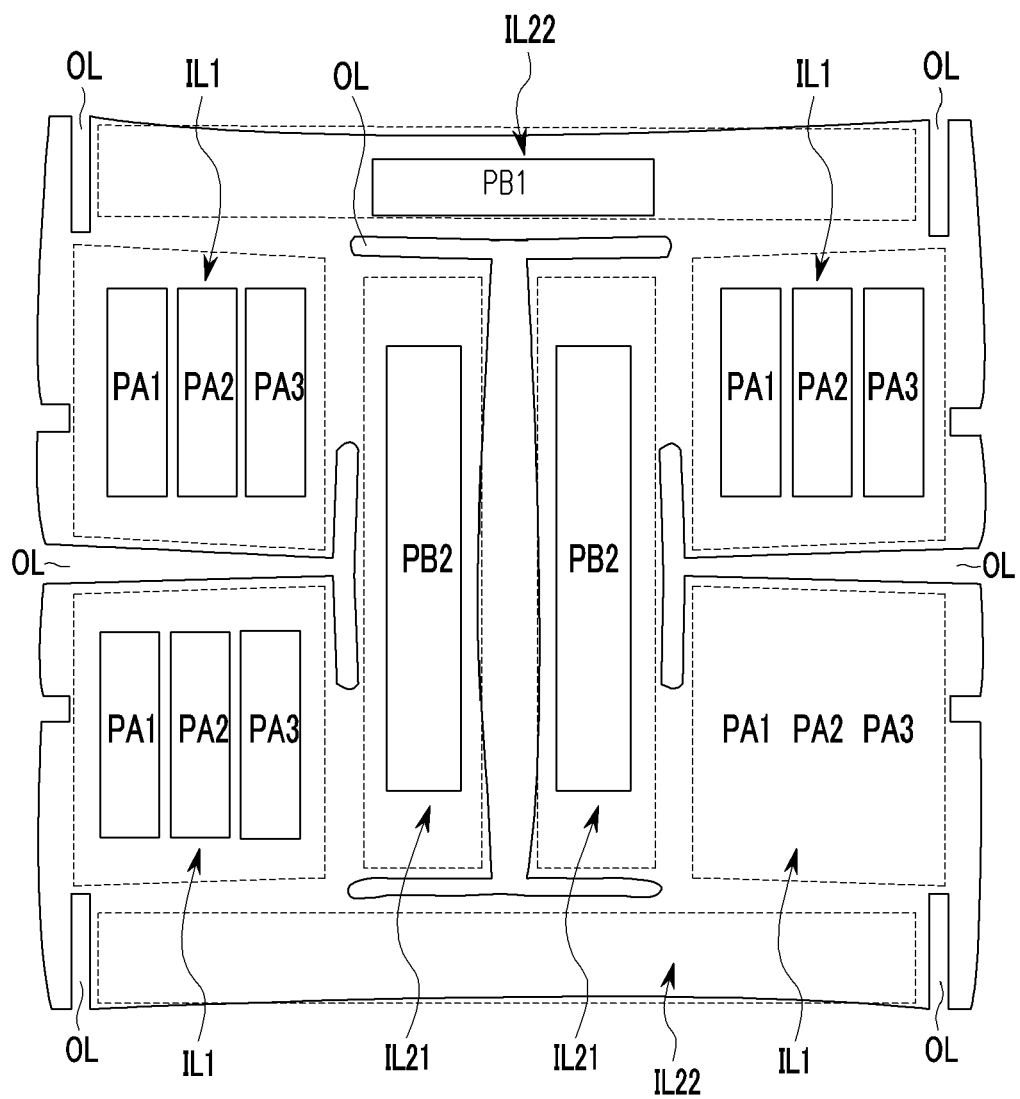
FIG. 4 is a plan view of the substrate of FIG. 2 in a state which the substrate is stretched, according to an exemplary embodiment.

FIG. 4 is a plan view of the substrate of FIG. 2 in a state which the substrate is stretched, according to an exemplary embodiment. Referring to FIG. 4, when the substrate 100 is stretched in the first direction X and/or the second direction Y, the widths of the plurality of cutouts OLs may be increased from the stretching.

Referring to FIG. 2, when the substrate is not stretched, the resistance value the resistance sensing sensor 48 transmitted to the data driver 55 and/or the image processor 57 is maintained equal to or less than a predetermined level. Therefore, when the resistance value transmitted to the data driver 55 and/or the image processor 57 is equal to or greater than the predetermined level, the data driver 55 and the image processor 57 may generate data signals and/or an image data to drive only the main pixel. In this case, a black gray data signal may be applied to the sub-pixel.

Referring to FIG. 4, when the substrate is stretched, the sensing lines may be stretched together with the substrate 100, so that resistance values of the sensing lines may increase. Therefore, when the resistance values transmitted to the data driver 55 and/or the image processor 57 is greater than a predetermined resistance value due to the increase in the resistance values of the sensing lines from the stretching, the data driver 55 and/or the image processor 57 may recognize the position information corresponding to the distorted pixel group disposed adjacent to an intersection point of the first sensing line 602 and the second sensing line 604 of which the resistance values is greater than the predetermined resistance value. In addition, the data driver 55 and/or the image processor 57 generates data signals and image data so that both of the main pixel PA and the sub-pixel PB disposed adjacent to the intersection point the first and second sensing lines 602 and 604 of which the resistance value is greater than the predetermined resistance value may be driven.

When the resistance value is transmitted from the resistance sensing sensor to the data driver 55, the data driver 55 may dither or upscale the image data transmitted from the image processor to generate modified digital signals applied to the corresponding main pixel and the corresponding sub-pixel.

According to an exemplary embodiment, a degree and a position of the distortion in the substrate may be recognized from the change of resistance value when the substrate is stretched.

Furthermore, a resolution of the display may be decreased due to the stretching. According to the exemplary embodiment, a position of the distortion in the substrate is recognized from the sensing line, and the display may drive the sub-pixel PB disposed adjacent to the deformed portion, thereby maintain the resolution of the display.

Next, an interlayer structure of one pixel of the display according to the exemplary embodiment will be described with reference to the accompanying drawings.

The exemplary embodiment illustrates an organic light emitting diode display as an example of the display, but the exemplary embodiments are not limited thereto. Therefore, although the display illustrates one pixel including a driving transistor and a switching transistor, the exemplary embodiments may further include at least one compensation transistor and initialization transistors. The display may include additional signal lines according to the number of transistors included.

Figure 5:
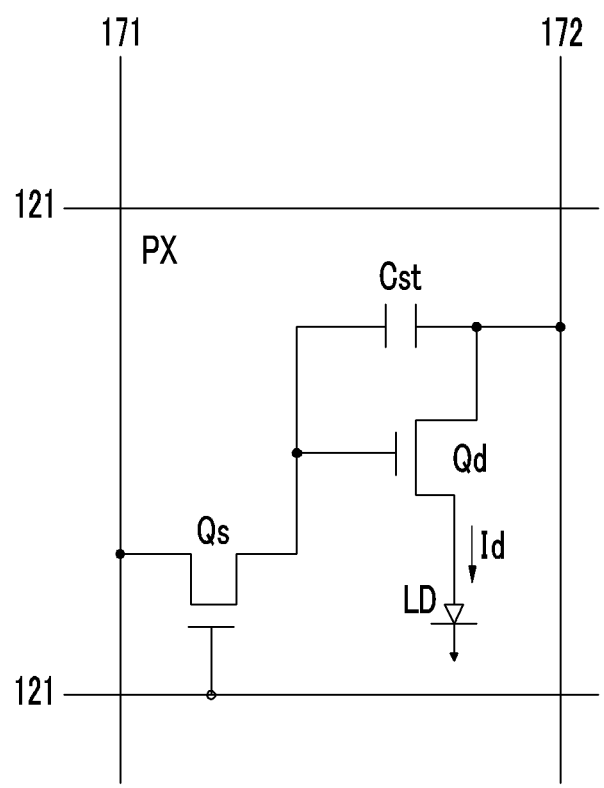
FIG. 5 is an equivalent circuit diagram of one pixel of an organic light emitting diode display according to an exemplary embodiment.

FIG. 5 is an equivalent circuit diagram of one pixel of an organic light emitting diode display according to an exemplary embodiment. Referring to FIG. 5, the organic light emitting diode display according to an exemplary embodiment includes a plurality of signal lines 121, 171, and 172 and a pixel PX connected to the plurality of signal lines 121, 171, and 172.

The signal lines include gate lines 121 transmitting gate signals (or scanning signals), data lines 171 transmitting data signals, and driving voltage lines 172 transmitting driving voltages. The gate lines 121 are disposed extending approximately in a row direction in parallel with each other, and the data lines 171 are disposed extending approximately in a column direction in parallel with each other. However, the exemplary embodiments are not limited thereto, and the driving voltage lines 172 may be disposed extending in the row direction, the column direction, or be disposed in a net shape.

One pixel PX includes a switching transistor Qs, a driving transistor Qd, a storage capacitor Cst, and an organic light emitting element LD.

The switching transistor Qs includes a control terminal, an input terminal, and an output terminal, wherein the control terminal is connected to the gate line 121, the input terminal is connected to the data line 171, and the output terminal is connected to a control terminal of the driving transistor Qd. The switching transistor Qs transmits the data signal received from the data line 171 to the control terminal of the driving transistor Qd in response to the scanning signal received from the gate line 121.

The driving transistor Qd includes the control terminal, an input terminal, and an output terminal, wherein the control terminal is connected to the output terminal of the switching transistor Qs, the input terminal is connected to the driving voltage line 172, and the output terminal is connected to the organic light emitting element LD. The driving transistor Qd transmits an output current $I_{LD}$ having a magnitude in response to on a voltage applied between the control terminal and the output terminal.

The capacitor Cst is connected between the control terminal and the input terminal of the driving transistor Qd. The capacitor Cst is charged with the data signal applied to the control terminal of the driving transistor Qd, and may maintain the data signal even after the switching transistor Qs is turned off.

The organic light emitting element LD, which may be, for example, an organic light emitting diode (OLED), includes an anode connected to the output terminal of the driving transistor Qd and a cathode connected to a common voltage $V_{SS}$. The organic light emitting element LD emits light having light intensity in response to the output current $I_{LD}$ of the driving transistor Qd to display an image. The organic light emitting element LD may include an organic material emitting at least one of primary colors, such as three primary colors including a red color, a green color, and a blue color, to display an image by combination of the primary colors.

The switching transistor Qs and the driving transistor Qd may be n-channel field effect transistors (FETs). Alternatively, at least one of the switching transistor Qs and the driving transistor Qd may be a p-channel FET. In addition, the transistors Qs and Qd, the capacitor Cst, and the organic light emitting element LD may have various connections.

Figure 6:
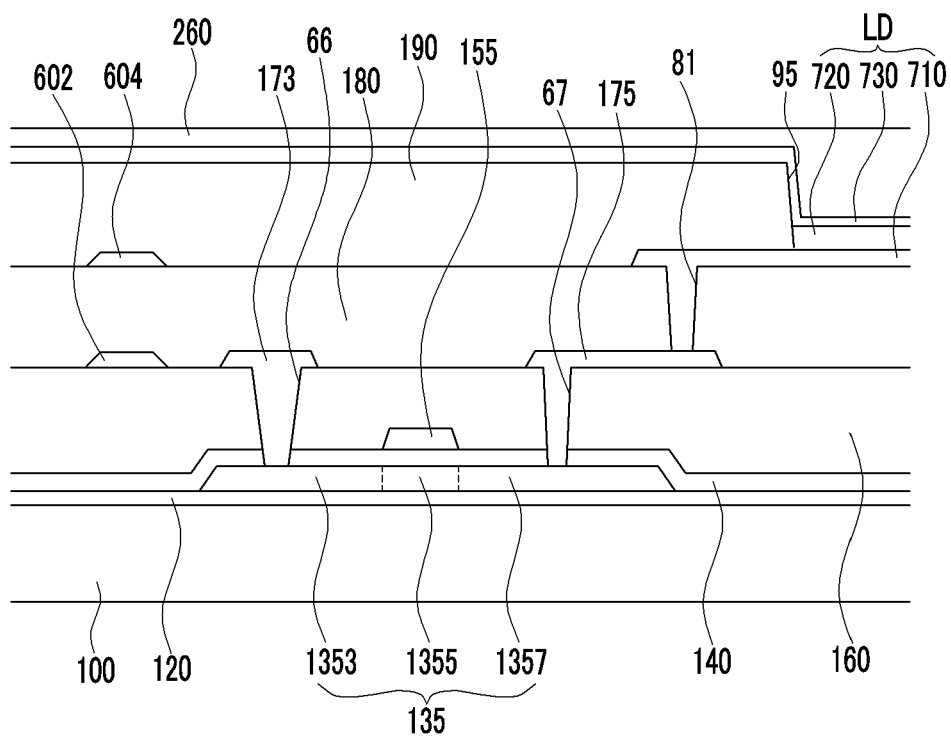
FIG. 6 is a cross-sectional view of one pixel of the organic light emitting diode display according to an exemplary embodiment.

FIG. 6 is a cross-sectional view of one pixel of the organic light emitting diode display of FIG. 5. Since interlayer configurations of the driving transistor Qd and the switching transistor Qs are mostly the same, description of the driving transistor Qd and the organic light emitting element LD of FIG. 5 will be mainly described with reference to FIG. 6. Hereinafter, the driving transistor Qd will be referred to as a transistor.

Referring to FIG. 6, an organic light emitting diode display may include a substrate 100 and a buffer layer 120 disposed on the substrate 100. The substrate 100 may be the stretchable substrate as shown in FIGS. 2 and 3. The buffer layer 120 may be formed of a single layer of a silicon nitride ($SiN_X$) or a dual-layer structure including a silicon nitride ($SiN_X$) and a silicon oxide ($SiO_2$) stacked. The buffer layer 120 may flatten a surface and reducing or preventing permeation of impurities and/or moisture.

A semiconductor 135 made of polysilicon is disposed on the buffer layer 120. The semiconductor 135 is divided into a channel region 1355, and a source region 1353 and a drain region 1357 formed at respective sides of the channel region 1355. The channel region 1355 of the semiconductor is made of an intrinsic semiconductor, which is a polysilicon that is not doped with impurities. The source region 1353 and the drain region 1357 are made of impurity semiconductor, which is polysilicon that is doped with conductive impurities. The impurities doped in the source region 1353 and the drain region 1357 may be any one of p-type impurities and n-type impurities.

A gate insulating layer 140 is disposed on the semiconductor 135. The gate insulating layer 140 may be at least one layer including at least one of a tetraethyl orthosilicate (TEOS), a silicon nitride, and a silicon oxide.

A gate electrode 155 is disposed on the semiconductor 135, overlapping with the channel region 1355. The gate electrode 155 may be formed of at least one layer made of a low resistance material such as Al, Ti, Mo, Cu, Ni, and an alloy thereof or a material resistant against corrosion.

A first interlayer insulating layer 160 is formed on the gate electrode 155. The first interlayer insulating layer 160 may be formed of at least one layer including at least one of a TEOS, a silicon nitride, a silicon oxide, or the like, similar to the gate insulating layer 140.

The first interlayer insulating layer 160 and the gate insulating layer 140 may include a source contact hole 66 and a drain contact hole 67 each exposing the source region 1353 and the drain region 1357, respectively.

A first sensing line 602, a source electrode 173, and a drain electrode 175 are formed on the first interlayer insulating layer 160. The source electrode 173 is connected to the source region 1353 through the source contact hole 66, and the drain electrode 175 is connected to the drain region 1357 through the drain contact hole 67.

The source electrode 173 and the drain electrode 175 may be formed of at least one layer of a low resistance material including at least one of Al, Ti, Mo, Cu, Ni, and an alloy thereof, or a material resistant against corrosion. For example, the source electrode 173 and the drain electrode 175 may be a triple layer of Ti/Cu/Ti, Ti/Ag/Ti, and Mo/Al/Mo.

The first sensing line 602 may be formed of at least one layer including at least one of a conductive nano material, a metal nano wire, a carbon nano tube (CNT), a conductive polymer, a metal nano fiber, and a graphene.

The gate electrode 155, the source electrode 173, and the drain electrode 175, respectively correspond to a control terminal, an input terminal, and an output terminal of the transistor of FIG. 5 together with the semiconductor 135. A channel of the transistor is formed in the semiconductor 135 between the source electrode 173 and the drain electrode 175.

A second interlayer insulating layer 180 is disposed on the source electrode 173 and the drain electrode 175. The second interlayer insulating layer 180 includes a contact hole 81 exposing the drain electrode 175. The second interlayer insulating layer 180 may be formed of at least one layer made of a TEOS, a silicon nitride, a silicon oxide, or the like, similar to the first interlayer insulating layer, and may be made of a low-k organic material.

A second sensing line 604 and a first electrode 710 are disposed on the second interlayer insulating layer 180. The second sensing line 604 may be made of the same material as that of the first sensing line 602. According to the exemplary embodiment, the first sensing line 602 is disposed on the first interlayer insulating layer and the second sensing line 604 is disposed on the second interlayer insulating layer 180, the exemplary embodiments are not limited thereto. Therefore, the first sensing line 602 and the second sensing line 604 may be disposed on the same layer with the gate line or the data line, a separate interlayer insulating layer may be additionally disposed between the first sensing line 602 and the second sensing line 604.

The first electrode 710 is electrically connected to the drain electrode 175 through the contact hole 81, and may be an anode of the organic light emitting element LD of FIG. 5.

According to exemplary embodiments, the second interlayer insulating layer 180 is disposed between the first electrode 710 and the drain electrode 175, but the exemplary embodiments are not limited thereto, and the first electrode 710 may be formed on the same layer with the drain electrode 175 and may also be formed integrally with the drain electrode 175.

A pixel definition layer 190 is disposed on the first electrode 710. The pixel definition layer 190 has an opening 95 exposing the first electrode 710. The pixel definition layer 190 may be formed of a resin such as polyacrylates, polyimides, or the like, a silica based inorganic material, and the like.

An organic emission layer 720 is disposed in the opening 95 of the pixel definition layer 190. The organic emission layer 720 is formed of plural layers including at least one of an emission layer, a hole-injection layer (HIL), a hole-transporting layer (HTL), an electron-transporting layer (ETL), and an electron-injection layer (EIL).

According to the exemplary embodiments, the hole-injection layer may be disposed on the first electrode 710, which is the anode, and the hole-transporting layer, the emission layer, the electron-transporting layer, and the electron-injection layer may be sequentially stacked on the hole-injection layer.

A second electrode 730 is disposed on the pixel definition layer 190 and the organic emission layer 720. The second electrode 730 corresponds to the cathode of the organic light emitting element LD. Therefore, the first electrode 710, the organic emission layer 720, and the second electrode 730 may form the organic light emitting element LD.

The organic light emitting diode display may have a top display type structure, a bottom display type structure, or a double-sided display type structure depending on a direction in which the organic light emitting element LD emits light. When the organic light emitting diode display has the top display type structure, the first electrode 710 is formed of a reflective layer and the second electrode 730 is formed of a transflective layer or a transmissive layer. When the organic light emitting diode display has the bottom display type structure, the first electrode 710 is formed of a transflective layer or transmissive layer, and the second electrode 730 is formed of a reflective layer. When the organic light emitting diode display has the double-sided display type structure, the first electrode 710 and the second electrode 730 are formed of a transmissive layer or a transflective layer.

The reflective layer and the transflective layer may be made of at least one metal including magnesium (Mg), silver (Ag), gold (Au), calcium (Ca), lithium (Li), chromium (Cr), and aluminum (Al), or an alloy thereof. The reflective layer and the transflective layer may be determined by their thicknesses, and the transflective layer may be formed at a thickness of 200 nm or less. The thinner the thickness of the transflective layer, the higher the transmittance. However, when the thickness of the transflective layer is excessively thin, a resistance of the layer may be increased.

The transparent layer may be formed of a material such as an indium tin oxide (ITO), an indium zinc oxide (IZO), a zinc oxide (ZnO), an indium oxide ($In_2O_3$), or the like.

An encapsulation member 260 is formed on the second electrode. The encapsulation member 260 may include at least one layer including organic layers and inorganic layers, and be formed by alternately stacking the organic layers and the inorganic layers.

The organic layer may be formed of a polymer, and may include at least one layer formed of any one of polyethylene terephthalate, polyimide, polycarbonate, epoxy, polyethylene, and polyacrylate. For example, the organic layer may be formed of a polyacrylate. In detail, the organic layer may include a polymerized monomer composition including a diacrylate based monomer and a triacrylate based monomer. A mono-acrylate based monomer may be further included in the monomer composition. Furthermore, any known photo-initiator such as TPO may be included in the monomer composition, but the exemplary embodiments are not limited thereto.

The inorganic layer may be at least one layer including a metal oxide or a metal nitride. In detail, the inorganic layer may include any one of $SiN_x$, $Al_2O_3$, $SiO_2$, and $TiO_2$.

The uppermost layer exposed to the outside in the encapsulation member may be an inorganic layer formed to reduce or prevent permeation of moisture into the organic light emitting element.

A halogenated metal layer (not shown) including LiF may be additionally included between the second electrode and the encapsulation member. The halogenated metal layer may reduce or prevent damage to a lower layer when the inorganic layer of the encapsulation member is formed by a sputtering scheme or a plasma depositing scheme. The organic layer may have an area smaller than that of the inorganic layer, such that the inorganic layer may completely cover the organic layer.

Figure 7:
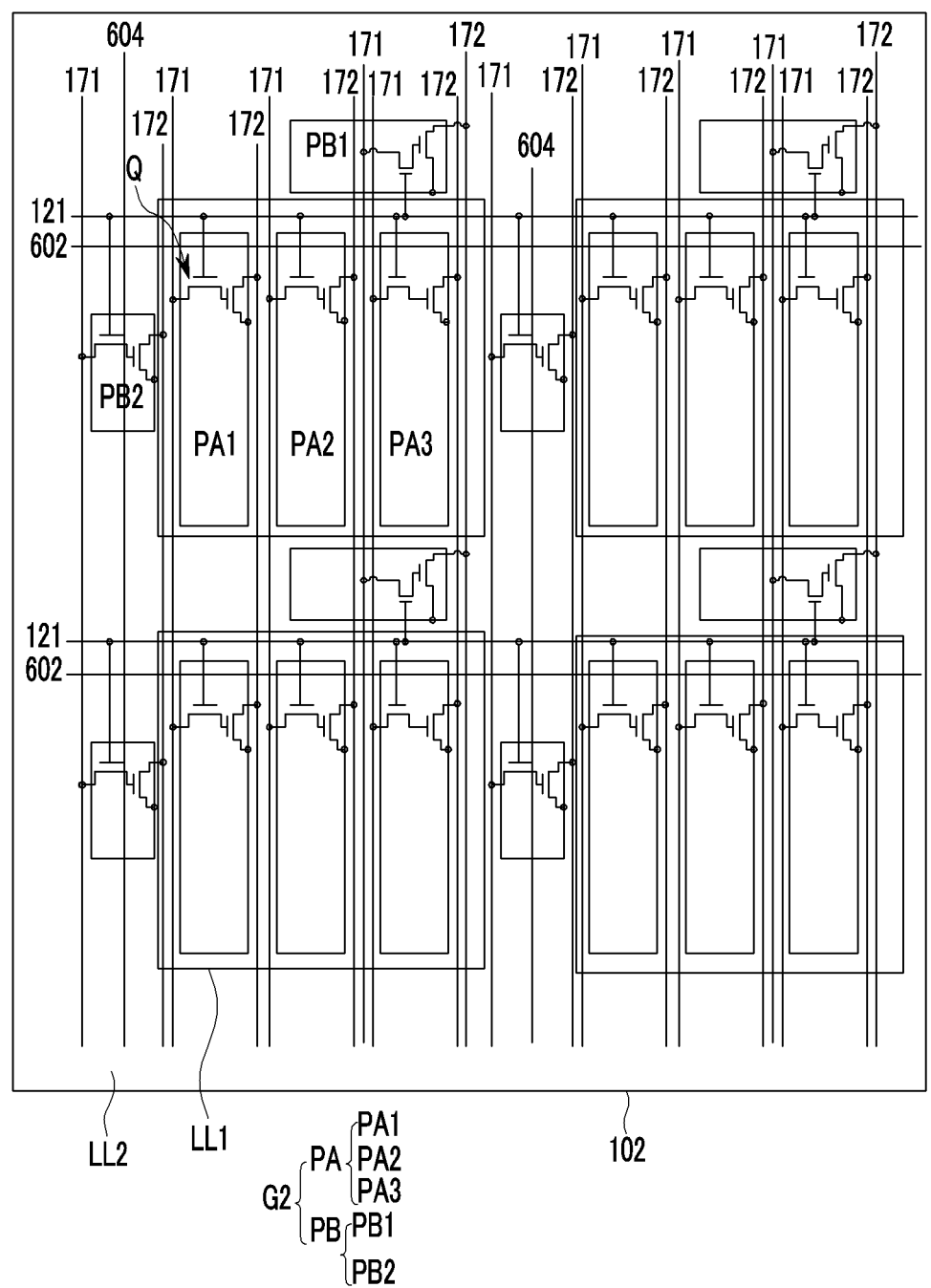
FIG. 7 is a schematic plan view of a stretchable display according to an exemplary embodiment.

FIG. 7 is a schematic plan view of a stretchable display 1002 according to an exemplary embodiment.

The stretchable display 1002 of FIG. 7 is substantially similar with the stretchable display 1000 illustrated in FIG. 1, and therefore, only components of the stretchable display of FIG. 7 which is different from those of the stretchable display of FIG. 1 will be described in detail.

Referring to FIG. 7, the stretchable display 1002 according to an exemplary embodiment includes a substrate 102, pixels disposed on the substrate 102, and signal lines 121, 171, and 172 connecting the pixels.

The substrate 102 includes first small substrates LL1 and second small substrates LL2, the second small substrates LL2 having relatively higher elasticity than that of the first small substrates LL1. The first small substrates LL1 are formed substantially in a quadrangle shape and are disposed spaced apart from each other at predetermined intervals in a matrix. The second small substrates LL2 are disposed between adjacent first small substrates LL1 connecting the adjacent first small substrates LL1 to each other. After the first small substrates LL1 are formed, the second small substrates LL2 may be formed using a solution process, or the like, to connect between the first small substrates LL1.

The first small substrate LL1 may include polyimide, and the second small substrate LL2 may include a stretchable material such as elastomer or polyurethane.

In the display 1000 of FIG. 1, the substrate 100 is distorted as the widths of the plurality of cutouts OLs is increased or decreased when the substrate 100 is stretched. In the display 1002 of FIG. 7, the substrate is distorted as the second small substrate LL2 having the higher elasticity is stretched or shrunk.

The pixels include a main pixel PA and a sub-pixel PB. The main pixel PA is disposed on the first small substrates LL1, and the sub-pixel PB is disposed on the second small substrates LL2.

The signal lines may include gate lines 121, data lines 171, driving voltage lines 172, and sensing lines 602 and 604. The signal lines do not need to bypass the plurality of cutouts OLs, so the signal lines may be formed straight.

According to the display 1002 shown in FIG. 7, one pixel group G2 includes one main pixel PA having pixels PA1, PA2, and PA3 and a sub-pixel PB having pixels PB1 and PB2.

The main pixel PA may include a red pixel PA1, a green pixel PA2, and a blue pixel PA3, respectively, and may further include a white pixel (not shown). The sub-pixel PB may display the same color as any one pixel of the main pixel PA, including a red color, a green color, and a blue color. It is preferable that pixels of the subpixel PB are green pixels PB1 and PB2.

Figure 8:
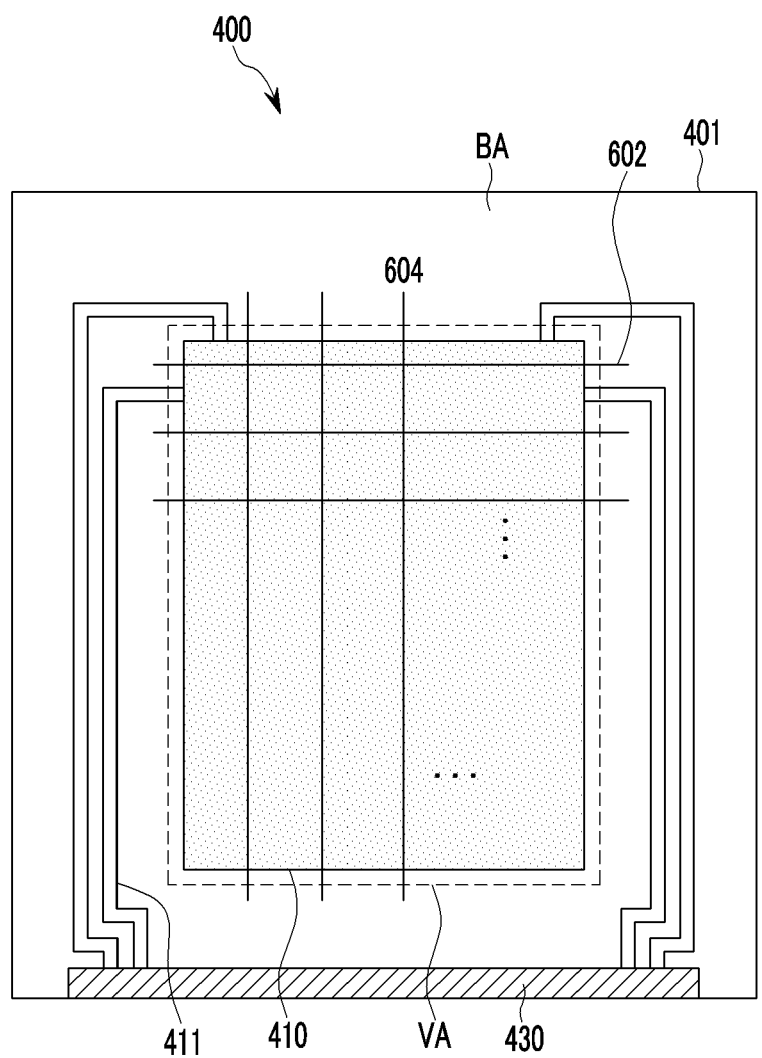
FIG. 8 is a schematic plan view of a stretchable display according to an exemplary embodiment.

FIG. 8 is a schematic plan view of a stretchable display according to an exemplary embodiment.

Since the stretchable display of FIG. 8 is substantially similar with the stretchable display illustrated in FIG. 1, and therefore, only components of the stretchable display of FIG. 8 which is different from those of the stretchable display of FIG. 1 will be described in detail.

The display of FIG. 8 includes a display panel (not shown) including the pixels of FIG. 1 and a touch panel 400 attached onto the display panel.

The touch panel 400 includes a touch sensor 410 formed on a touch substrate 401. The touch sensor 410 may be various types of touch sensors including, for example, a capacitive touch sensor. The touch sensor includes a plurality of touch electrodes (not shown) formed on at least one layer.

The touch electrode may include a transparent conductive material such as a metal oxide, for example, an ITO or an IZO, a metal nano wire, a conductive polymer, a thin metal layer, or the like.

When the touch sensor 410 is a capacitive touch sensor, the touch electrode of the touch sensor may receive a sensing input signal from a driver, generate a sensing output signal in response to a touch, and transmit the sensing output signal to the driver 430.

If the touch electrode forms a self-sensing capacitor together with an external object, the touch electrode receives a sensing input signal, and the self-sensing capacitor is charged with a predetermined quantity of electric charges. When a touch by the external object such as a finger, or the like, is present, the predetermined quantity of electric charges charged in the self-sensing capacitor may change, and a sensing output signal different from the received sensing input signal may be generated. The driver 430 may recognize touch information including an existence of the touch, a touch position, and the like, from the change of the sensing output signal.

If the touch electrode forms a mutual-sensing capacitor between touch electrodes adjacent to each other, each touch electrode receives a sensing input signal from the driver, and the mutual-sensing capacitor is charged with a predetermined quantity of electric charges. When a touch by an external object such as a finger, or the like, is present, the predetermined quantity of electric charges charged in the mutual-sensing capacitor may change, and the changed quantity of electric charges may be transmitted as a sensing output signal. The driver 430 may recognize the touch information including an existence of touch, a touch position, and the like, from the sensing output signal.

The plurality of touch electrodes may be disposed on the same layer or be disposed on different layers. The touch electrodes disposed on the different layers may be disposed on different surfaces of one substrate or be disposed on different layers on the same surface of the substrate.

The plurality of touch electrodes are connected to the driver 430 through a plurality of signal wirings 411 and a pad part (not shown). The signal wirings 411 may input an input signal to the touch electrodes or output an output signal to the driver through the pad part (not show). The signal wiring may be disposed in a peripheral area BA. However, the exemplary embodiments are not limited thereto, and the signal wirings 411 may also be disposed in a touch area VA.

The touch panel according to an exemplary embodiment may further include sensing lines 602 and 604 disposed on the touch substrate 401. That is, compared to the exemplary embodiment in FIG. 2 which includes the sensing lines 602 and 604 disposed together with the transistors on the stretchable substrate, the sensing lines according to the exemplary embodiment in FIG. 8 may be disposed on the touch substrate 401. The sensing lines 602 and 604 may be formed insulated from the touch electrodes.

The touch panel 400 may be affixed or adhered onto the display panel using an adhesive, or the like, and may be stretched or distorted together with the display panel when the display panel is stretched or distorted. Therefore, the sensing lines disposed on the touch substrate 401 of the touch panel 400 instead of the display panel may recognize a degree of stretch and/or a distortion of the substrate.

The exemplary embodiments in FIG. 8 illustrates that the sensing lines 602 and 604 are formed separately from the touch electrodes, the exemplary embodiments are not limited thereto. For example, a resistance may be sensed using the touch electrodes without forming the sensing lines. When the touch panel is distorted, resistances of the touch electrodes and the signal wirings 411 connected to the touch electrodes may be changed. Therefore, when the resistance sensing sensor 48 (refer to FIG. 2) is connected to the signal wirings 411 connected to the touch electrodes, a position at which the resistance is changed may be easily figured out.

According to the exemplary embodiments, the display panel disposed on the stretchable substrate may include sub-pixels to reduce a decrease of resolution when the substrate is distorted. The display panel may recognize the position of the distorted pixel using the sensing lines, and selectively drive the sub-pixels to compensate the decrease of resolution.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A stretchable display comprising:
   a stretchable substrate comprising first areas and second areas;
   main pixels disposed on the first areas of the stretchable substrate, the main pixels configured to display different colors; and
   at least one sub-pixel disposed on the second areas of the stretchable substrate, the at least one sub-pixel being configured to display one color that is the same as any one of the main pixels,
   wherein the first areas comprise islands; and
   wherein the second areas comprise horizontal bridges and vertical bridges.

2. The stretchable display of claim 1, further comprising:
   sensing lines disposed on the stretchable substrate,
   wherein a resistance of the sensing lines is configured to change in response to a degree of distortion of the stretchable substrate.

3. The stretchable display of claim 2, wherein the sensing lines comprise:
   first sensing lines disposed extending in a first direction; and
   second sensing lines disposed crossing the first sensing lines,
   wherein the first sensing lines and the second sensing lines are insulated from each other.

4. The stretchable display of claim 2, wherein the sensing lines comprise at least one material selected from the group consisting of metal nano wire, carbon nano tube, and graphene.

5. The stretchable display of claim 1, wherein the stretchable substrate comprises cutouts disposed between adjacent first areas and adjacent second areas, and the first area and the second area are disposed adjacently.

6. The stretchable display of claim 1, wherein:
   the first areas comprise first small substrates; and
   the second areas comprise second small substrates.

7. The stretchable display of claim 6, wherein the first small substrate and the second small substrate are made of different materials.

8. The stretchable display of claim 6, wherein the second areas connect adjacent first areas.

9. The stretchable display of claim 7, wherein the second small substrate is made of a stretchable material.

10. The stretchable display of claim 1, wherein the main pixels comprise a red pixel, a green pixel, and a blue pixel.

11. The stretchable display of claim 10, wherein the sub-pixel comprises a green pixel.

12. The stretchable display of claim 1, wherein the sub-pixel is selectively driven in response to a degree of distortion of the stretchable substrate.

13. The stretchable display of claim 12, wherein the stretchable substrate is configured to stretch in a first direction.

14. The stretchable display of claim 13, wherein the stretchable substrate is configured to simultaneously stretch in the first direction and a second direction, wherein the second direction is orthogonal to the first direction.

15. The stretchable display of claim 1, further comprising:
   a touch substrate disposed on the stretchable substrate; and
   sensing lines disposed on the touch substrate,
   wherein a resistance of the sensing lines is configured to change in response to a degree of distortion of the stretchable substrate.

16. The stretchable display of claim 15, wherein:
   the sensing lines comprise:
   first sensing lines disposed extending in a first direction; and
   second sensing lines disposed crossing the first sensing lines.

17. The stretchable display of claim 16, wherein:
   the sensing lines comprise at least one material selected from the group consisting of metal nano wire, carbon nano tube, and graphene.

18. The stretchable display of claim 1, wherein:
   each of the main pixels and sub-pixels comprises:
   a transistor; and
   a light emitting element connected to the transistor.

19. The stretchable display of claim 1, further comprising:
   a touch substrate disposed on the stretchable substrate,
   wherein a resistance of the touch substrate is configured to change in response to a degree of distortion of the stretchable substrate.

* * * * *